United States Patent
Sugawara

(10) Patent No.: US 7,215,515 B2
(45) Date of Patent: May 8, 2007

(54) MAGNETORESISTIVE SENSOR HAVING A CONDUCTING PATH LAYER FORMED FROM A PLURALITY OF METAL ISLANDS WITHIN AN INSULATING MATRIX

(75) Inventor: Takahiko Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 409 days.

(21) Appl. No.: 10/950,722

(22) Filed: Sep. 27, 2004

(65) Prior Publication Data

US 2005/0036243 A1 Feb. 17, 2005

Related U.S. Application Data

(63) Continuation of application No. PCT/JP02/03119, filed on Mar. 28, 2002.

(51) Int. Cl.
G11B 5/39 (2006.01)

(52) U.S. Cl. .................................... 360/322
(58) Field of Classification Search ................ 360/322
See application file for complete search history.

(56) References Cited

U.S. PATENT DOCUMENTS

| | | | |
|---|---|---|---|
| 6,064,552 A * | 5/2000 | Iwasaki et al. ............ | 360/322 |
| 6,828,039 B2 * | 12/2004 | Sugawara .................. | 428/621 |
| 6,937,447 B2 * | 8/2005 | Okuno et al. ............ | 360/324.1 |
| 6,972,146 B2 * | 12/2005 | Den et al. ................. | 428/138 |
| 7,016,162 B2 * | 3/2006 | Yuasa et al. ............... | 360/322 |
| 7,061,725 B2 * | 6/2006 | Seigler ..................... | 360/313 |
| 7,093,347 B2 * | 8/2006 | Nowak et al. ........... | 29/603.07 |
| 2004/0042127 A1 * | 3/2004 | Hoshiya et al. ........... | 360/322 |
| 2004/0264064 A1 * | 12/2004 | Sakakima .................. | 360/322 |

FOREIGN PATENT DOCUMENTS

| JP | 2000-090415 | 3/2000 |
|---|---|---|
| JP | 2001-143227 | 5/2001 |

* cited by examiner

Primary Examiner—Jefferson Evans
(74) Attorney, Agent, or Firm—Greer, Burns & Crain, Ltd.

(57) ABSTRACT

A magnetoresistive sensor including a lower electrode layer, a discontinuous structure film provided on the lower electrode layer, the discontinuous structure film being composed of an insulator matrix and a plurality of metal islands dispersively arranged in the insulator matrix, a magnetoresistive film provided on the discontinuous structure film, and an upper electrode layer provided on the magnetoresistive film. The discontinuous structure film is partially etched at a central region thereof to thereby make a conduction between the upper electrode layer and the lower electrode layer at the central region through the magnetoresistive film and the metal islands.

10 Claims, 4 Drawing Sheets

MAGNETORESISTIVE SENSOR HAVING A CONDUCTING PATH LAYER FORMED FROM A PLURALITY OF METAL ISLANDS WITHIN AN INSULATING MATRIX

This is a continuation of International PCT Application NO. PCT/JP02/03119, filed Mar. 28, 2002, which was not published in English.

BACKGROUND OF THE INVENTION

1. Field of the Invention

The present invention relates to a magnetoresistive sensor for use in a magnetic recording device such as a magnetic disk drive and a magnetic tape drive.

2. Description of the Related Art

In association with a reduction in size and an increase in recording density of a magnetic disk drive in recent years, the flying height of a head slider has become smaller and it has been desired to realize contact recording/reproduction such that the head slider flies a very small height above a recording medium or comes into contact with the recording medium. Further, a conventional magnetic induction head has a disadvantage such that its reproduction output decreases with a decrease in peripheral speed of a magnetic disk as the recording medium (relative speed between the head and the medium) caused by a reduction in diameter of the magnetic disk. To cope with this disadvantage, there has recently extensively been developed a magnetoresistive head (MR head) whose reproduction output does not depend on the peripheral speed and capable of obtaining a large output even at a low peripheral speed. Such a magnetoresistive head is now a dominating magnetic head. Further, a magnetic head utilizing a giant magnetoresistive (GMR) effect is also commercially available at present.

With higher-density recording in a magnetic disk drive, a recording area of one bit decreases and a magnetic field generated from the medium accordingly becomes smaller. The recording density of a magnetic disk drive currently on the market is about 10 Gbit/in$^2$, and it is rising at an annual rate of about 200%. It is therefore desired to develop a magnetoresistive sensor and a magnetoresistive head which can support a minute magnetic field range and can sense a change in small external magnetic field. At present, a spin valve magnetoresistive sensor utilizing a spin valve GMR effect is widely used in a magnetic head. In such a magnetoresistive sensor having a spin valve structure, a magnetization direction in a free ferromagnetic layer (free layer) is changed by a signal magnetic field from a recording medium, so that a relative angle of this magnetization direction to a magnetization direction in a pinned ferromagnetic layer (pinned layer) is changed, causing a change in resistance of the magnetoresistive sensor.

In the case of using this magnetoresistive sensor in a magnetic head, the magnetization direction in the pinned layer is fixed to a direction along the height of a magnetoresistive element, and the magnetization direction in the free layer in the condition where no external magnetic field is applied is generally designed to a direction along the width of the magnetoresistive element, which direction is perpendicular to the pinned layer. Accordingly, the resistance of the magnetoresistive sensor can be linearly increased or decreased according to whether the direction of the signal magnetic field from the magnetic recording medium is parallel or antiparallel to the magnetization direction of the pinned layer. Such a linear resistance change facilitates signal processing in the magnetic disk drive.

In the conventional magnetoresistive sensor, a sense current is passed in a direction parallel to the film surface of the magnetoresistive element to read a resistance change according to an external magnetic field. In such a case of a CIP (Current In the Plane) structure that a current is passed in a direction parallel to the GMR film surface, the output from the sensor decreases with a decrease in sense region defined by a pair of electrode terminals. Further, in the spin valve magnetoresistive sensor having the CIP structure, insulating films are required between the GMR film and an upper magnetic shield and between the GMR film and a lower magnetic shield. That is, the distance between the upper and lower magnetic shields is equal to the sum of the thickness of the GMR film and a value twice the thickness of each insulating film. At present, the thickness of the insulating film is about 20 nm at the minimum. Accordingly, the distance between the upper and lower magnetic shields becomes equal to the sum of the thickness of the GMR film and about 40 nm.

However, with this distance, it is difficult to support a reduction in length of a recording bit on the recording medium, and the current CIP spin valve magnetoresistive sensor cannot meet the requirement that the distance between the magnetic shields is to be reduced to 40 nm or less. In these circumstances, it is considered that a magnetic head having a CIP structure utilizing a spin valve GMR effect can support a recording density of 20 to 40 Gbit/in$^2$ at the maximum. Even by applying specular scattering as a latest technique, the maximum recording density is considered to be 60 Gbit/in$^2$.

As mentioned above, the increase in recording density of a magnetic disk drive is rapid, and it is expected that a recording density of 80 Gbit/in$^2$ will be desired by 2002. When the recording density becomes 80 Gbit/in$^2$ or higher, it is very difficult to support such a high recording density even by using a CIP spin valve GMR magnetic head to which the latest specular scattering is applied, from the viewpoints of output and the distance between the magnetic shields. As a post spin valve GMR intended to cope with the above problem, there have been proposed a tunnel MR (TMR) and a GMR having a CPP (Current Perpendicular to the Plane) structure such that a current is passed in a direction perpendicular to the GMR film surface.

The TMR has a structure that a thin insulating layer is sandwiched between two ferromagnetic layers. The amount of a tunnel current passing across the insulating layer is changed according to the magnetization directions in the two ferromagnetic layers. The TMR shows a very large resistance change and has a good sensitivity, so that it is expected as a promising post spin valve GMR. On the other hand, in the case of the GMR having the CPP structure, the output increases with a decrease in sectional area of a portion of the GMR film where a sense current is passed. This feature of the CPP structure is a large advantage over the CIP structure. The TMR is also considered to be a kind of CPP structure, because a current is passed across the insulating layer from one of the ferromagnetic layers to the other ferromagnetic layer. Therefore, the TMR also has the above advantage.

FIG. 1 shows a schematic sectional view of a magnetoresistive sensor 2 in the prior art. The magnetoresistive sensor 2 is composed of a lower electrode layer 4, an insulator matrix 6, a magnetoresistive film 8, and an upper electrode layer 10. A contact hole 12 is formed at a substantially central portion of the insulator matrix 6. The magnetoresistive film 8 is in contact with the lower electrode layer 4 at the contact hole 12. A sense current is passed from the upper electrode layer 10 through the contact hole 12 of the magnetoresistive film 8 toward the lower electrode layer 4.

Dry etching suitable for microfabrication is adopted for the formation of the contact hole 12. The relation between the output ΔR from the magnetoresistive sensor 2 having a CPP structure and the diameter D of the contact hole 12 is expressed as follows:

$$\Delta R \propto 1/D^2$$

In most devices used in the fields of information processing, communication, magnetic recording, optical recording, etc., the electrical connection of two conductors between which an insulator is interposed is established by a circular hole (contact hole) formed in the insulator. It is general that the contact hole is formed by dry etching suitable for microfabrication of devices.

Dry etching is a process including decomposing a supplied gas by a plasma to generate active species such as ions and radicals, and exposing a substrate to the active species to cause a reaction between the active species and a material to be etched, thereby performing patterning and resist removal. However, the minimum diameter of a contact hole formed by a current dry etching technique is 200 nm in the case of using an i-line stepper or 100 nm even in the case of using an FIB (Focused Ion Beam). In the latter case, there is an intrinsic problem that metal atoms adhere to a sidewall.

To improve the performance and characteristics of a magnetoresistive sensor, microscopic structure control on the order of nanometers is required and it is therefore necessary to form a microscopic contact hole. However, such a microscopic contact hole cannot be formed by the current dry etching technique. In addition, etching uniformity and pattern size controllability are also required.

As a magnetoresistive sensor having a contact hole of microscopic size on the order of nanometers, the present inventor has proposed a magnetoresistive sensor having a granular structure film composed of an insulator matrix and granular metal (metal granules) dispersed in the insulator matrix, thereby making a conduction between an upper electrode layer and a lower electrode layer through a magnetoresistive film and the granular metal (Japanese Patent Laid-open No. 2001-143227). In such a magnetoresistive sensor, the granular structure film is formed by simultaneous evaporation of metal and insulator. Accordingly, there is a possibility that the electrical junction between the granular metal and the lower electrode layer may be insufficient, so that the junction resistance may become large to cause a reduction in magnetoresistance change rate.

SUMMARY OF THE INVENTION

It is therefore an object of the present invention to provide a magnetoresistive sensor having a contact hole of microscopic size on the order of nanometers.

It is another object of the present invention to provide a magnetoresistive sensor having a contact hole of microscopic size on the order of nanometers which can reduce the junction resistance between metal islands and a lower electrode layer to thereby obtain a large magnetoresistance change rate.

In accordance with an aspect of the present invention, there is provided a magnetoresistive sensor including upper and lower electrode layers; a conducting path layer provided between the upper and lower electrode layers, the conducting path layer having a first region and a second region smaller in film thickness than the first region, the conducting path layer being formed by arranging a plurality of metal islands in an insulator matrix; and a magnetoresistive film provided between the conducting path layer and one of the upper and lower electrode layers; the other of the upper and lower electrode layers and the magnetoresistive film being in conduction through the second region of the conducting path layer.

Preferably, the metal islands are formed of Cr, and the insulator matrix is formed of $SiO_2$.

In accordance with another aspect of the present invention, there is provided a manufacturing method for a magnetoresistive sensor, including the steps of depositing a lower electrode layer on a substrate; forming a plurality of metal islands on the lower electrode layer; depositing an insulator on the lower electrode layer after forming the metal islands so that the metal islands are embedded in the insulator to thereby form a conducting path layer; forming a resist pattern on the conducting path layer; partially etching the conducting path layer by using the resist pattern as a mask to thereby expose a part of the metal islands; depositing a magnetoresistive film on the conducting path layer; and depositing an upper electrode layer on the magnetoresistive film.

In accordance with a further aspect of the present invention, there is provided a magnetoresistive sensor including a lower electrode layer; a discontinuous structure film provided on the lower electrode layer, the discontinuous structure film including an insulator matrix and a plurality of metal islands dispersively arranged in the insulator matrix; a magnetoresistive film provided on the discontinuous structure film; and an upper electrode layer provided on the magnetoresistive film; the discontinuous structure film being partially etched at a central region thereof to thereby make a conduction between the upper electrode layer and the lower electrode layer at the central region through the magnetoresistive film and the metal islands.

Preferably the metal islands are formed of Cr, and the insulator matrix is formed of $SiO_2$.

In accordance with a still further aspect of the present invention, there is provided a manufacturing method for a magnetoresistive sensor, including the steps of depositing a first conductive film on a substrate; forming a first resist pattern on the first conductive film; etching the first conductive film by using the first resist pattern as a mask to thereby obtain a lower electrode layer having a desired shape; forming a plurality of metal islands on the lower electrode layer; depositing an insulator matrix on the lower electrode layer so that the metal islands are embedded in the insulator matrix to thereby form a discontinuous structure film; forming a second resist pattern on the discontinuous structure film; etching the discontinuous structure film by using the second resist pattern as a mask to remove an unwanted portion of the discontinuous structure film; forming a third resist pattern on the discontinuous structure film; etching a central region of the discontinuous structure film so that the tops of the metal islands present in the central region, by using the third resist pattern as a mask; depositing a magnetoresistive film on the discontinuous structure film; depositing a second conductive film on the magnetoresistive film; forming a fourth resist pattern on the second conductive film; and etching the second conductive film by using the fourth resist pattern as a mask to thereby obtain an upper electrode layer having a desired shape.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 2:
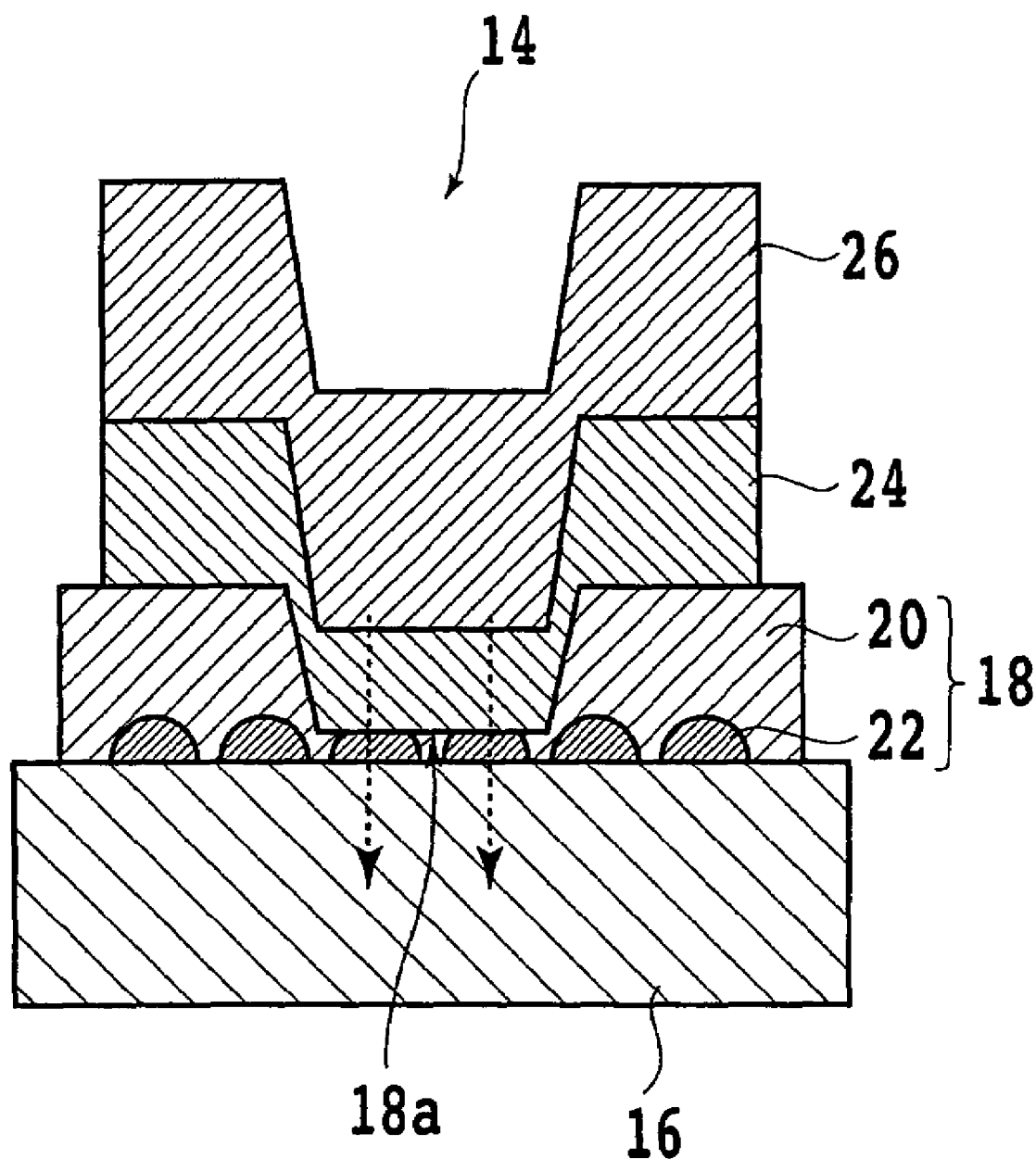
FIG. 2 is a schematic sectional view of a magnetoresistive sensor according to a preferred embodiment of the present invention.

Referring to FIG. 2, there is shown a schematic sectional view of a magnetoresistive sensor 14 having a CPP structure according to a preferred embodiment of the present invention. The magnetoresistive sensor 14 is composed of a lower electrode layer 16, a discontinuous structure film 18 formed on the lower electrode layer 16, a magnetoresistive film (MR film) 24 formed on the discontinuous structure film 18, and an upper electrode layer 26 formed on the MR film 24. Each of the lower electrode layer 16 and the upper electrode layer 26 is formed of Cu or the combination of Cu and Au.

The discontinuous structure film 18 includes an insulator matrix 20 formed of $SiO_2$, for example, and a plurality of metal islands 22 dispersively arranged in the insulator matrix 20. Each metal island 22 is formed of chromium (Cr), for example. The discontinuous structure film 18 is partially etched at its central region 18a so that the top of a part of the metal islands 22 is exposed. The upper electrode layer 26 and the lower electrode layer 16 are in conduction at this etched region 18a through the magnetoresistive film 24 and the exposed metal islands 22. That is, the metal islands 22 present at the etched region 18a of the discontinuous structure film 18 form a contact hole.

Figure 3:
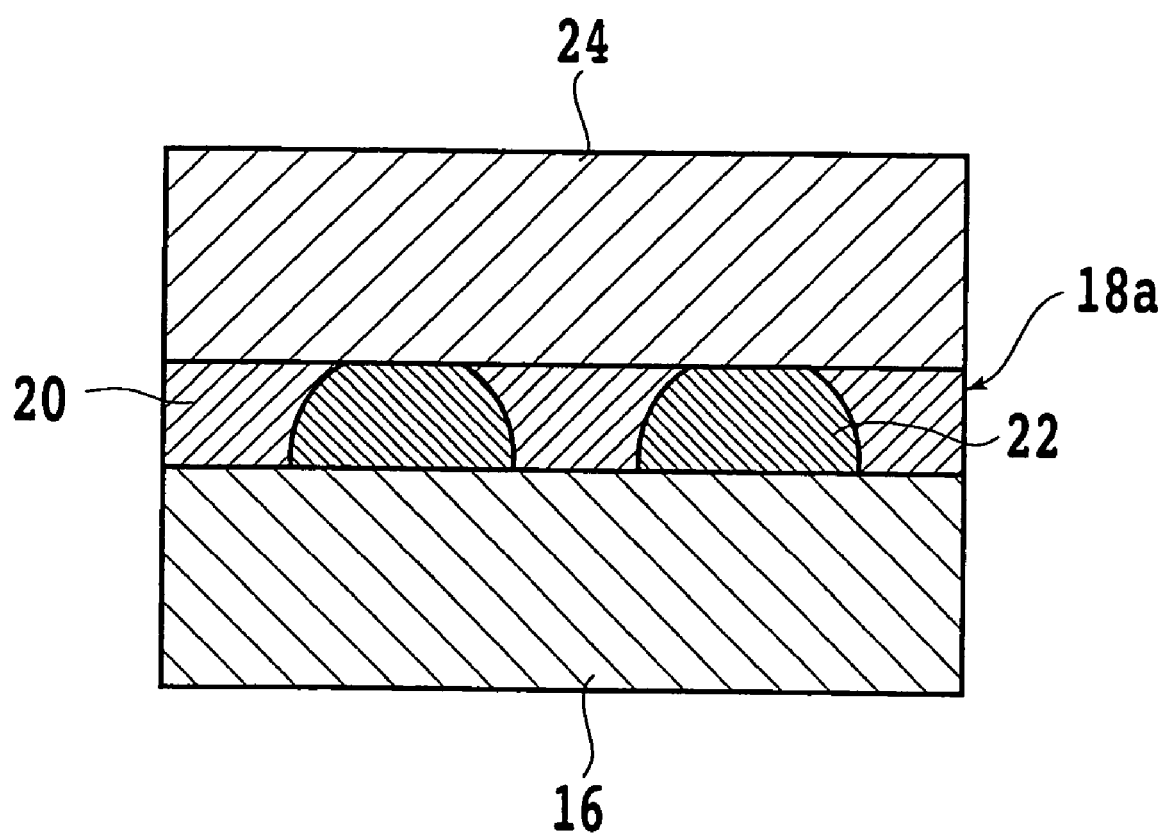
FIG. 3 is an enlarged sectional view of an essential part of the magnetoresistive sensor shown in FIG. 2.

FIG. 3 is an enlarged sectional view of an essential part of the preferred embodiment shown in FIG. 2. As apparent from FIGS. 2 and 3, the magnetoresistive film 24 is connected through the metal islands 22 to the lower electrode layer 16 at the etched region 18a of the discontinuous structure film 18. Accordingly, when a sense current is passed between the upper electrode layer 26 and the lower electrode layer 16, the sense current concentrically flows in the metal islands 22 having a low resistivity rather than in the insulator matrix 20 having a high resistivity. As a result, it is possible to obtain the same effect as that obtained by reducing the diameter of a contact hole.

Figure 1:
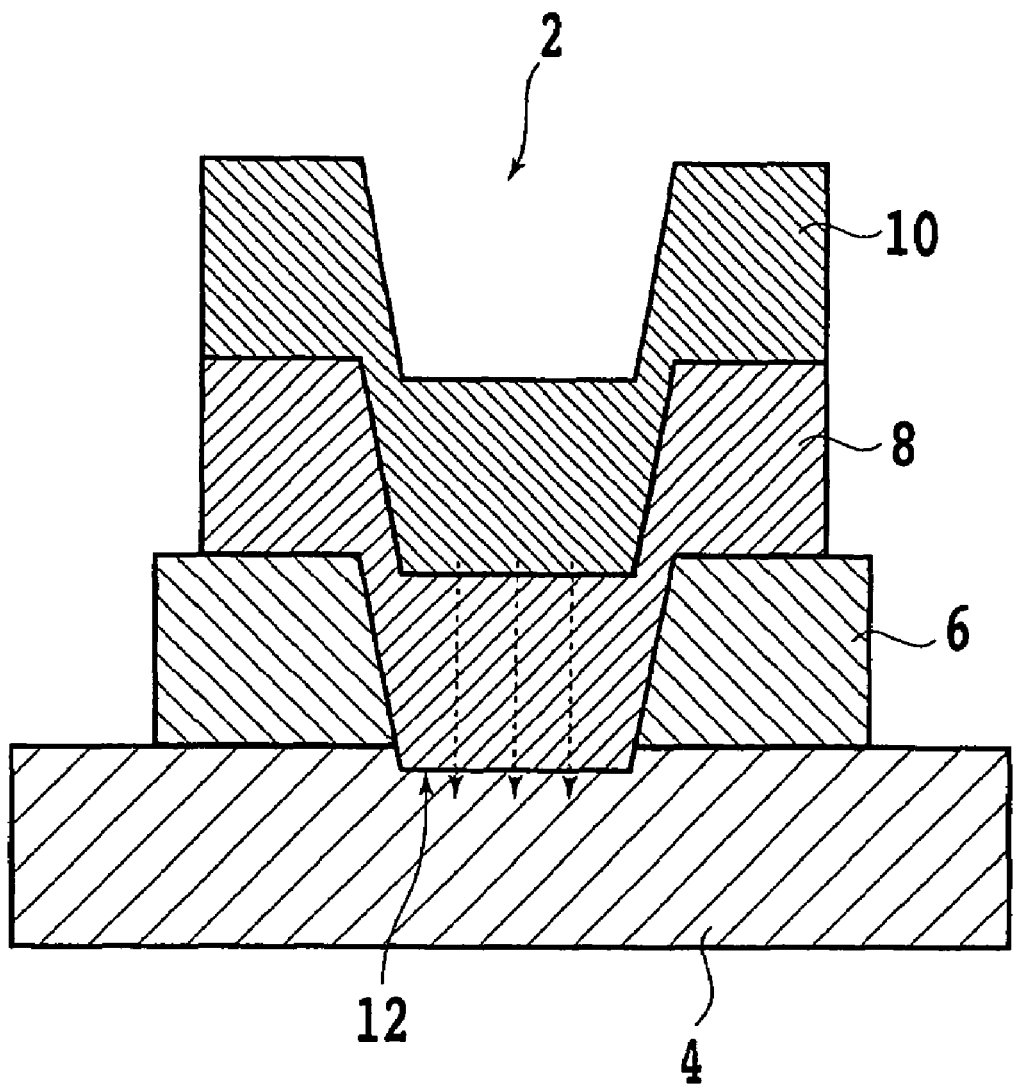
FIG. 1 is a schematic sectional view of a prior art magnetoresistive sensor.

The prior art magnetoresistive sensor 2 shown in FIG. 1 provides an output inversely proportional to the square of the diameter of a portion of the magnetoresistive film 8 formed in contact with the lower electrode layer 4, i.e., the diameter of the contact hole 12. To the contrary, the magnetoresistive sensor 14 according to the preferred embodiment shown in FIG. 2 provides an output inversely proportional to the sectional area and number of the metal islands 22 formed in contact with the magnetoresistive film 24 and the lower electrode layer 16. In the above configuration including the discontinuous structure film 18, the lower electrode layer 16 formed in contact with one of the opposite surfaces of the discontinuous structure film 18, and the magnetoresistive film 24 formed in contact with the other surface of the discontinuous structure film 18, the diameter of a continuously contact portion of the metal islands 22 to the lower electrode layer 16 and the magnetoresistive film 24, i.e., the apparent diameter D' of a contact hole, will now be calculated. The following assumptions are used for the calculation.

(1) The number of the metal islands 22 formed in contact with the magnetoresistive film 24 and the lower electrode layer 16 is n.

(2) The contact portion of each metal island 22 formed in contact with the magnetoresistive film 24 and the lower electrode layer 16 is circular, and has a diameter d.

On the above assumptions, the apparent diameter D' of the contact hole is expressed as follows:

$$D' = d \times n^{1/2} \quad (1)$$

Figure 4A:
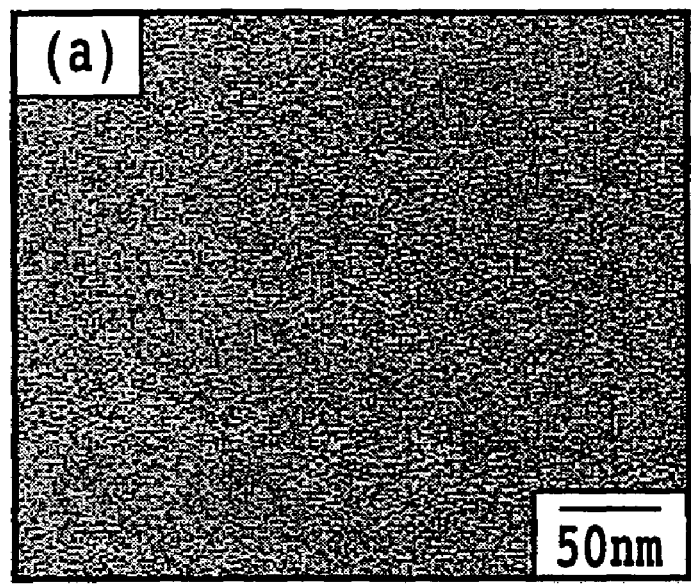
FIG. 4(a) is a photographic plan view of a Co 1.5 nm/$SiO_2$ 20 nm film as a discontinuous structure film, observed by a transmission electron microscope.
Figure 4B:
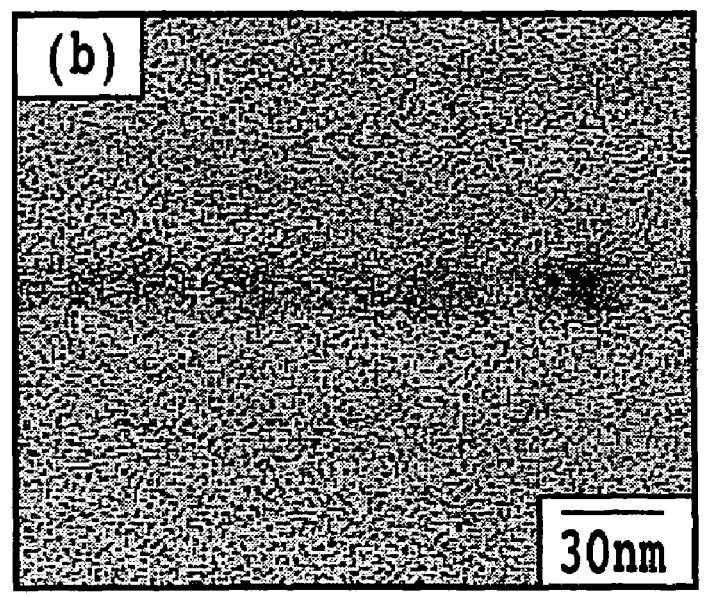
FIG. 4(b) is a photographic sectional view similar to FIG. 4A.

It is generally known that in the initial stage of metal thin-film formation using a sputtering process the metal shows a discontinuous island structure. A Co/$SiO_2$ film is known as an example of the discontinuous structure film including metal islands dispersed in an insulator matrix, each metal island having a size on the order of nanometers. FIGS. 4(a) and 4(b) respectively show photographic plan and sectional views of a Co 1.5 nm/$SiO_2$ 20 nm film formed on a thermally oxidized Si substrate by using a sputtering process, observed by a transmission electron microscope.

As apparent from FIGS. 4(a) and 4(b), the Co/$SiO_2$ film has a discontinuous structure such that a plurality of Co islands (dark regions) are dispersed in an insulator matrix of $SiO_2$ (bright regions). As also apparent from FIG. 4(b), the diameter of each metal island 22 is about 2 nm. In the Co/$SiO_2$ film shown in FIGS. 4(a) and 4(b), each Co island is involved (embedded) in the $SiO_2$ insulator matrix and is not exposed, so that the resistivity of this Co/$SiO_2$ film is larger than several $\mu\Omega\cdot cm$ as the resistivity of a normal Co metal film. For example, the resistivity of this Co/$SiO_2$ film becomes about $10^5$ $\mu\Omega\cdot cm$. In other words, the Co/$SiO_2$ film with the Co islands unexposed shows the characteristics of an insulator.

There will now be described a manufacturing method for the magnetoresistive sensor 14 according to the preferred embodiment. First, a Cu film having a thickness of 500 nm as the lower electrode layer 16 is deposited on a substrate (not shown), and a resist pattern is next formed on the Cu film. The Cu film is next etched by using the resist pattern as a mask to form the lower electrode layer 16 having a desired shape. Thereafter, a Co 1.5 nm/$SiO_2$ 20 nm film as the discontinuous structure film 18 having the same configuration as that shown in FIGS. 4(a) and 4(b) is deposited on the lower electrode layer 16 by sputtering. A resist pattern is next formed on the $SiO_2$ film 20, and the $SiO_2$ film is next etched by using the resist pattern as a mask to remove an unwanted portion of the $SiO_2$ film 20.

Further, a resist pattern is formed again on the $SiO_2$ film, and the $SiO_2$ film is next partially etched by using the resist pattern as a mask to form the discontinuous structure film 18 whose central region 18a as a contact hole has a thickness of 1.5 nm or less, under the etching conditions of 300 V, 300 mA, and 90 sec. Thereafter, the magnetoresistive film 24 having a thickness of 40 nm is deposited on the discontinuous structure film 18 by sputtering. The magnetoresistive film 24 includes at least one low-resistance film and at least two ferromagnetic films sandwiching the low-resistance film. Alternatively, the magnetoresistive film 24 has a ferromagnetic tunnel junction structure or a multilayer film structure composed of a ferromagnetic layer and a nonmagnetic layer.

In other words, the magnetoresistive film 24 may be provided by a spin valve GMR film such as a NiFe/Cu/NiFe/IrMn multilayer film, a laminated ferri spin valve GMR film such as a NiFe/Cu/CoFeB/Ru/CoFeB/PdPtMn multilayer film, or a tunnel junction type MR film (TMR film) such as a NiFe/Al$_2$O$_3$/NiFe/PdPtMn multilayer film. Thereafter, a Cu film having a thickness of 300 nm as the upper electrode layer 26 is deposited on the magnetoresistive film 24 by sputtering. A resist pattern is next formed on the Cu film, and the Cu film is next etched by using the resist pattern as a mask to form the upper electrode layer 26 having a desired shape. Thus, the magnetoresistive sensor 14 is completed.

A magnetoresistive sensor as a comparison was fabricated in the following manner. A plurality of Cr islands each having a thickness of 1.5 nm were formed on a lower electrode layer 16. Thereafter, an SiO$_2$ film having a thickness of 20 nm was deposited on the lower electrode layer so as to fully cover the Cr islands, thus forming a discontinuous structure film 18. Thereafter, the discontinuous structure film 18 was not etched, and a magnetoresistive film 24 and an upper electrode layer 26 are sequentially deposited on the discontinuous structure film 18. By using samples of the comparison and the present invention, the resistance was measured by a DC four-terminal method. Table 1 shows the results of measurement of the output and resistance in the present invention and the comparison together with the prior art magnetoresistive sensor having a CPP structure. The measurement of the output was made by a normal four-terminal method under the conditions of 2 mA for a current and 10$^5$ A/m for an applied magnetic field.

TABLE 1

| | | Resistance ($\Omega \cdot$ cm) | Output (mv) |
|---|---|---|---|
| Present Invention | The thickness of the contact hole in the magnetoresistive sensor was set to 1.5 nm. | 10$^2$ | 10 |
| Comparison | The thickness of the contact hole in the magnetoresistive sensor was set to 21.5 nm. | 10$^6$ | 0 |
| Prior Art | The magnetoresistive sensor having a CPP structure | 10 | 1 |

As apparent from Table 1, an output of 10 mV is obtained by the magnetoresistive sensor of the present invention, and an output of 1 mV is obtained by the prior art magnetoresistive sensor. That is, the output by the present invention is 10 times the output by the prior art. Accordingly, it is confirmed that the discontinuous structure film 18 according to the present invention can effectively reduce the diameter of the contact hole and can improve the output. In Table 1, the output by the comparison is zero for the reason that all the Cr islands as the contact hole are fully embedded in the SiO$_2$ film, so that no conduction can be made between the magnetoresistive film 24 and the lower electrode layer 16. While the discontinuous structure film 18 is formed between the lower electrode layer 16 and the magnetoresistive film 24 in the above preferred embodiment, the position of the discontinuous structure film 18 is not limited. For example, the discontinuous structure film 18 may be formed between the magnetoresistive film 24 and the upper electrode layer 26. Alternatively, the discontinuous structure film 18 may be formed in the lower electrode layer 16, the magnetoresistive film 24, or the upper electrode layer 26.

The number of the metal islands 22 functioning as the contact hole in the discontinuous structure film 18 in this preferred embodiment will now be calculated. The diameter of the contact hole in the prior art magnetoresistive sensor is 0.2 μm. Therefore, the apparent diameter D' of the contact hole in the magnetoresistive sensor of the present invention whose output obtained is 10 times that of the prior art magnetoresistive sensor becomes $0.2/10^{1/2} \approx 0.063$ μm. Assuming that the diameter of each metal island 22 is 2 nm from the photographic views shown in FIGS. 4A and 4B by a transmission electron microscope, the number n of the metal islands 22 as the contact hole is estimated to be $0.063^2/0.002^2 \approx 990$.

According to the present invention as described above, it is possible to provide a magnetoresistive sensor having a CPP structure which can reduce the apparent diameter of a contact hole and can improve an output. Furthermore, by considering the conditions of formation of the discontinuous structure film, the size and number of effective contact holes can be controlled.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A magnetoresistive sensor comprising:
   upper and lower electrode layers;
   a conducting path layer provided between said upper and lower electrode layers, said conducting path layer having a first region and a second region smaller in film thickness than said first region, said conducting path layer being formed by arranging a plurality of metal islands in an insulator matrix; and
   a magnetoresistive film provided between said conducting path layer and one of said upper and lower electrode layers;
   the other of said upper and lower electrode layers and said magnetoresistive film being in conduction through said second region of said conducting path layer.

2. The magnetoresistive sensor according to claim 1, wherein said insulator matrix comprises an insulator or a mixture of insulator and metal.

3. The magnetoresistive sensor according to claim 1, wherein said metal islands are formed of Cr.

4. The magnetoresistive sensor according to claim 1, wherein said insulator matrix is formed of SiO$_2$.

5. A manufacturing method for a magnetoresistive sensor, comprising the steps of:
   depositing a lower electrode layer on a substrate;
   forming a plurality of metal islands on said lower electrode layer;
   depositing an insulator on said lower electrode layer after forming said metal islands so that said metal islands are embedded in said insulator to thereby form a conducting path layer;
   forming a resist pattern on said conducting path layer;
   partially etching said conducting path layer by using said resist pattern as a mask to thereby expose a part of said metal islands;
   depositing a magnetoresistive film on said conducting path layer; and
   depositing an upper electrode layer on said magnetoresistive film.

6. A magnetoresistive sensor comprising:
a lower electrode layer;
a discontinuous structure film provided on said lower electrode layer, said discontinuous structure film comprising an insulator matrix and a plurality of metal islands dispersively arranged in said insulator matrix;
a magnetoresistive film provided on said discontinuous structure film; and
an upper electrode layer provided on said magnetoresistive film;
said discontinuous structure film being partially etched at a central region thereof to thereby make a conduction between said upper electrode layer and said lower electrode layer at said central region through said magnetoresistive film and said metal islands.

7. The magnetoresistive sensor according to claim 6, wherein said metal islands are formed of Cr.

8. The magnetoresistive sensor according to claim 6, wherein said insulator matrix is formed of $SiO_2$.

9. A manufacturing method for a magnetoresistive sensor, comprising the steps of:
depositing a first conductive film on a substrate;
forming a first resist pattern on said first conductive film;
etching said first conductive film by using said first resist pattern as a mask to thereby obtain a lower electrode layer having a desired shape;
forming a plurality of metal islands on said lower electrode layer;
depositing an insulator matrix on said lower electrode layer so that said metal islands are embedded in said insulator matrix to thereby form a discontinuous structure film;
forming a second resist pattern on said discontinuous structure film;
etching said discontinuous structure film by using said second resist pattern as a mask to remove an unwanted portion of said discontinuous structure film;
forming a third resist pattern on said discontinuous structure film;
etching a central region of said discontinuous structure film so that the tops of said metal islands present in said central region, by using said third resist pattern as a mask;
depositing a magnetoresistive film on said discontinuous structure film;
depositing a second conductive film on said magnetoresistive film;
forming a fourth resist pattern on said second conductive film; and
etching said second conductive film by using said fourth resist pattern as a mask to thereby obtain an upper electrode layer having a desired shape.

10. The manufacturing method according to claim 9, wherein said metal islands are formed of Cr, and said insulator matrix is formed of $SiO_2$.

* * * * *